US007949159B2

(12) United States Patent
Nakashiba

(10) Patent No.: US 7,949,159 B2
(45) Date of Patent: May 24, 2011

(54) SOLID-STATE IMAGING DEVICE, IMAGING METHOD AND IMAGING SYSTEM

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1082 days.

(21) Appl. No.: 11/783,145

(22) Filed: Apr. 6, 2007

(65) Prior Publication Data
US 2007/0236589 A1    Oct. 11, 2007

(30) Foreign Application Priority Data

Apr. 11, 2006   (JP) .................................. 2006-108812

(51) Int. Cl.
*G06K 9/00* (2006.01)
*H04N 5/335* (2006.01)
(52) U.S. Cl. ...................................... 382/124; 348/294
(58) Field of Classification Search .................. 382/124, 382/140, 145, 307; 257/291; 348/294
See application file for complete search history.

(56) References Cited

U.S. PATENT DOCUMENTS

| 5,389,805 A * | 2/1995 | Arakawa ....................... 257/222 |
| 6,821,809 B2 * | 11/2004 | Abe et al. ........................ 438/65 |
| 7,081,998 B2 * | 7/2006 | Shimizu et al. ............... 359/619 |

FOREIGN PATENT DOCUMENTS

| JP | 2000-217803 | 8/2000 |
| JP | 2004-134514 | 4/2004 |

* cited by examiner

*Primary Examiner* — Daniel G Mariam
(74) *Attorney, Agent, or Firm* — Young & Thompson

(57) ABSTRACT

A solid-state imaging device includes a semiconductor substrate, a light receiving portion, and a spacer. The solid-state imaging device photoelectrically converts light incident from an object to be imaged upon a light incidence surface in the light receiving portion provided in the semiconductor substrate, thereby acquiring an image of the object to be imaged based on a magnitude of an electric charge generated through the photoelectric conversion. On a part of the light incidence surface, the spacer is provided. The spacer prevents the object to be imaged from contacting the light incidence surface.

17 Claims, 9 Drawing Sheets

14a, 16   14b

SOLID-STATE IMAGING DEVICE, IMAGING METHOD AND IMAGING SYSTEM

This application is based on Japanese patent application No. 2006-108812, the content of which is incorporated hereinto by reference.

BACKGROUND

1. Technical Field

The present invention relates to a solid-state imaging device, and to an imaging method and an imaging system that employ the solid-state imaging device.

2. Related Art

Solid-state imaging devices so far developed include the one disclosed in Japanese Laid-open patent publication No. 2000-217803 (patent document 1). The solid-state imaging device according to this document includes a multitude of two-dimensionally aligned light receiving portions, to thereby pick up an image of a fingerprint brought into contact with a predetermined contact surface. In addition to the above cited document, prior art literature relevant to the present invention includes Japanese Laid-open patent publication No. 2004-134514 (patent document 2).

SUMMARY OF THE INVENTION

However, although the solid-state imaging device according to the patent document 1 is capable of acquiring an image of a surface element of the object to be imaged (for example, the fingerprint of a finger), the imaging device can barely pick up an image of an internal element of the object to be imaged (for example, a vein of the finger).

According to the present invention, there is provided a solid-state imaging device having a light incidence surface for receiving light incident from an object to be imaged, including: a semiconductor substrate; a light receiving portion provided in the semiconductor substrate; and a spacer provided on a part of the light incidence surface so as to prevent the object to be imaged from contacting the light incidence surface; wherein the spacer transmits the light from the object to be imaged; and light from the object to be imaged incident upon the light incidence surface is photoelectrically converted in the semiconductor substrate, so that the light receiving portion receives an electric charge generated by the photoelectric conversion, thereby acquiring an image of the object to be imaged.

The solid-state imaging device thus constructed includes the spacer. Accordingly, an image provided by the light from the region where the spacer is provided, namely the light transmitted through the spacer (first image) predominantly includes information of a surface element of the object to be imaged disposed in contact with the spacer. On the other hand, an image provided by the light from the region where the spacer is not provided, namely the light not transmitted through the spacer (second image) also includes information of an internal element of the object to be imaged, in addition to the information of the surface element. Picking up the difference between the first image and the second image, therefore, leads to acquisition of a clear image of the internal element of the object to be imaged.

According to the present invention, there is provided an imaging method, including: acquiring, with the solid-state imaging device, a first image of the object to be imaged provided by the light transmitted through the spacer thus to be incident upon the light incidence surface, and a second image of the object to be imaged provided by the light not transmitted through the spacer and incident upon the light incidence surface; and acquiring a differential image between the first image and the second image.

By the imaging method thus arranged, the solid-state imaging device according to the present invention is employed to acquire the first and the second image. And a differential image between those images is acquired. Such method enables acquiring a clear image of the internal element of the object to be imaged.

According to the present invention, there is provided an imaging system including: the solid-state imaging device; and a difference calculation unit acquiring a differential image between a first image of the object to be imaged provided by the light transmitted through the spacer thus to be incident upon the light incidence surface, and a second image of the object to be imaged provided by the light not transmitted through the spacer and incident upon the light incidence surface.

The imaging system thus configured includes the solid-state imaging device according to the present invention, and the difference calculation unit. Such configuration enables acquiring the first and the second image with the solid-state imaging device, and acquiring the differential image between those images with the difference calculation unit. Consequently, the imaging system provides a clear image of the internal element of the object to be imaged.

Thus, the present invention provides a solid-state imaging device, an imaging method and an imaging system that provide a clear image of an internal element of an object to be imaged.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
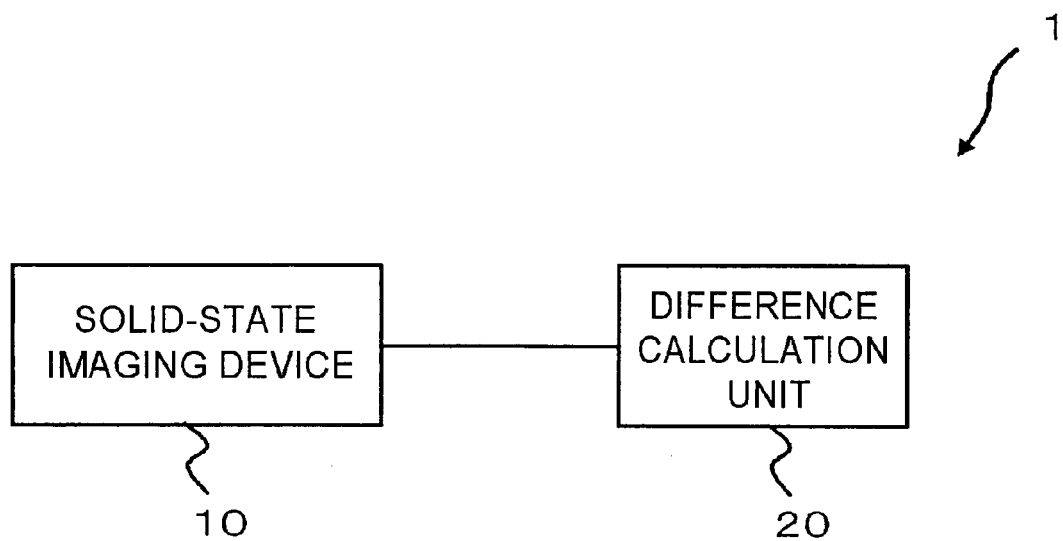
FIG. 1 is a block diagram showing a configuration of an imaging system according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a solid-state imaging device, an imaging method and an imaging system according to the present invention will be described in details, referring to the accompanying drawings. In the drawings, same constituents are given the same numerals, and the description thereof will not be repeated.

FIG. 1 is a block diagram showing a configuration of an imaging system according to an embodiment of the present invention. The imaging system 1 includes a solid-state imaging device 10, and a difference calculation unit 20. The difference calculation unit 20 serves to acquire a differential image between a first image and a second image. The first and the second image will be explained later. The difference calculation unit 20 is, for example, a computer terminal.

Figure 2:
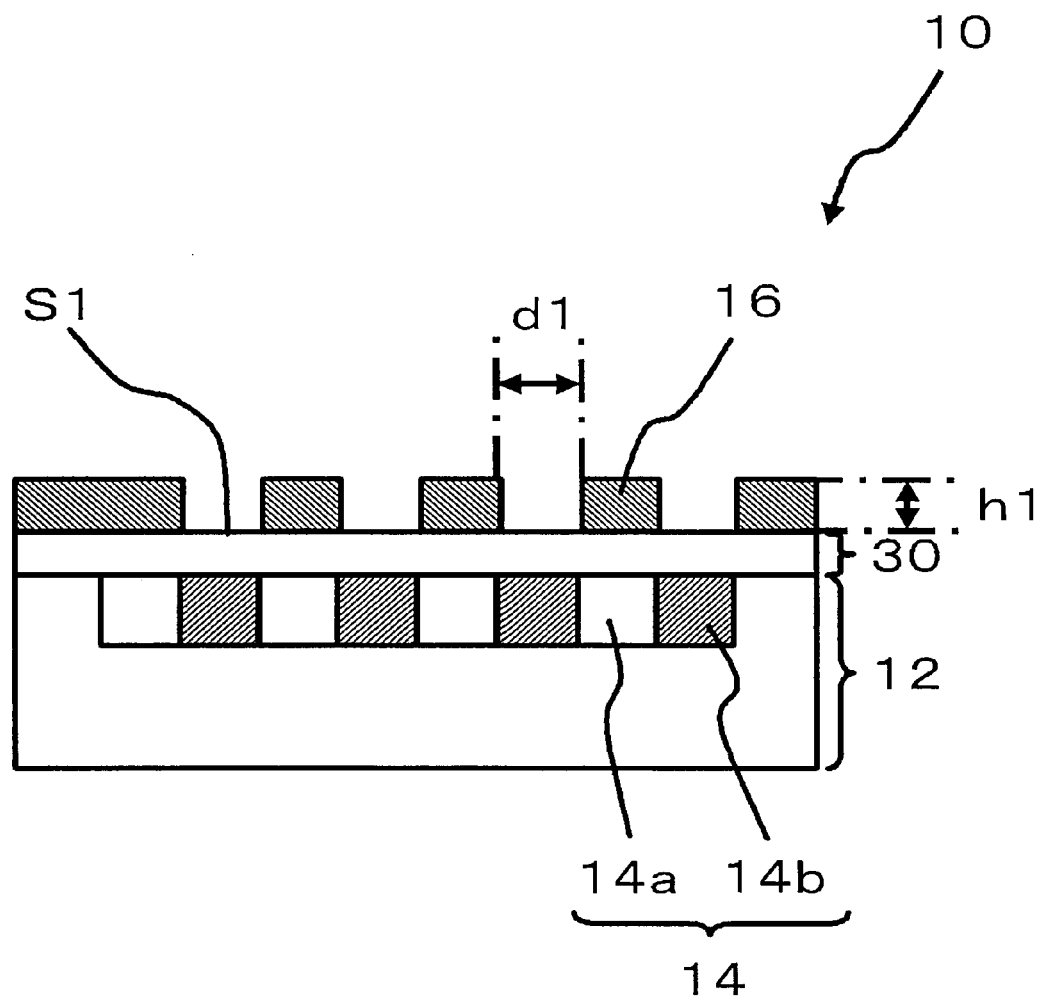
FIG. 2 is a cross-sectional view of a solid-state imaging device according to an embodiment of the present invention.
Figure 3:
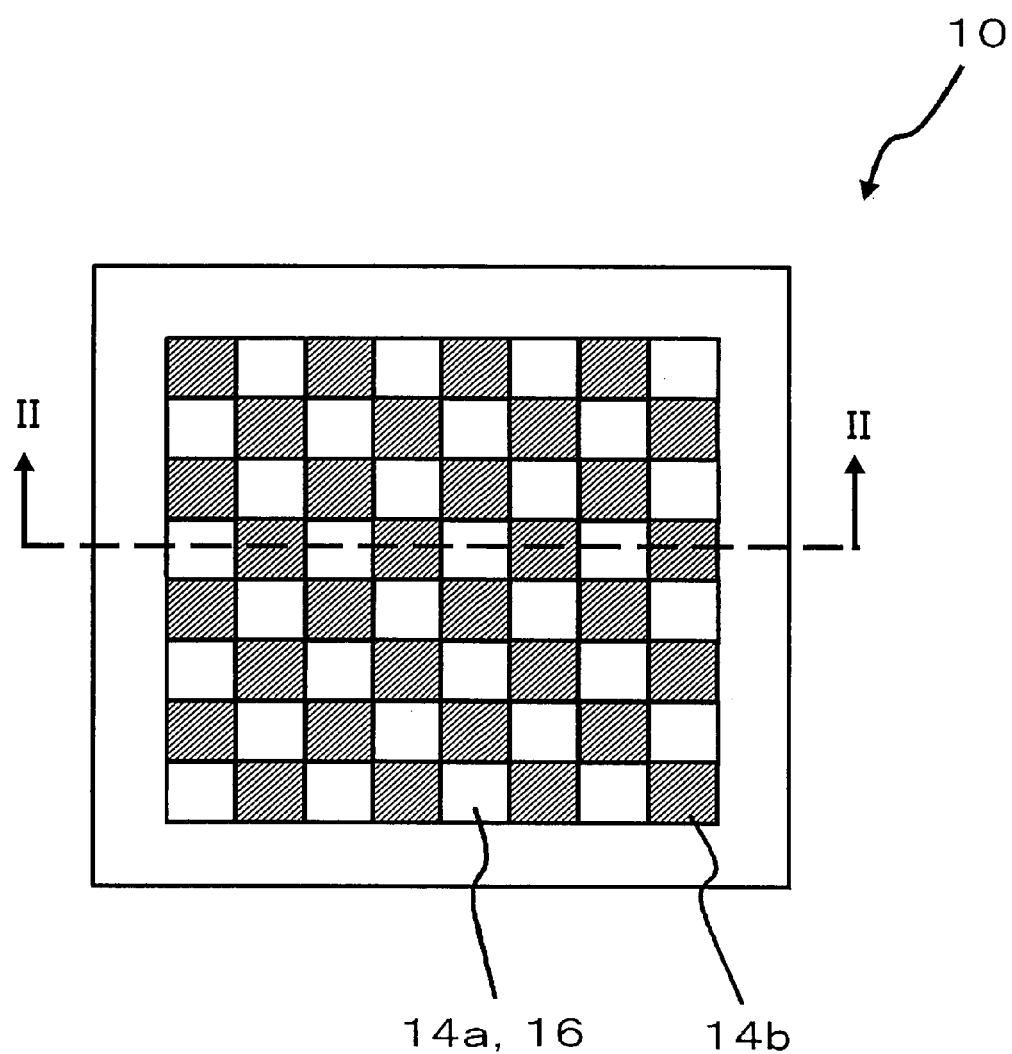
FIG. 3 is a plan view showing the solid-state imaging device of FIG. 2.

FIG. 2 is a cross-sectional view of the solid-state imaging device 10, which is an embodiment of the solid-state imaging device according to the present invention. FIG. 3 is a plan view showing the solid-state imaging device 10. The cross-section taken along a line II-II of FIG. 3 corresponds to FIG. 2.

The solid-state imaging device 10 includes a semiconductor substrate 12, a light receiving portion 14, and a spacer 16. In this embodiment, the semiconductor substrate 12 is a P-type silicon substrate. The solid-state imaging device 10 photoelectrically converts light incident from an object to be imaged upon a light incidence surface S1 (corresponding to a surface of an interconnect layer 30 to be described later, in this embodiment) in the light receiving portion 14 provided in the semiconductor substrate 12, thereby acquiring an image of the object to be imaged based on a magnitude of an electric charge generated through the photoelectric conversion.

The semiconductor substrate 12 includes a plurality of light receiving portions 14. To be more detailed, the light receiving portions 14 are provided in a superficial layer on the front surface (same side as the interconnect layer 30) of the semiconductor substrate 12. In this embodiment, the light receiving portions 14 are N-type impurity diffusion layers. The light receiving portions 14 constitute a photodiode in collaboration with the adjacently located semiconductor substrate 12.

On a part of the light incidence surface S1, spacers 16 are provided. The spacers 16 prevent the object to be imaged from contacting the light incidence surface S1. The spacers 16 may be constituted of a resin film or a permanent resist film, provided that the material transmits the light from the object to be imaged. Preferably, the light transmittance of the spacers 16 is 50% or higher.

Also, it is preferable that the thickness h1 of the spacers 16 is 10 μm to 250 μm, and more preferably approximately 100 μm. The thickness h1 of the spacers 16 is preferably in a range of 0.02 to 0.5, when an interval d1 between the spacers 16 is defined as 1.

In this embodiment the spacers 16 are, as is apparent from FIG. 3, aligned regularly, more specifically in a checker pattern in a plan view. Accordingly, the region where the spacers 16 are provided and the region where the spacers 16 are not provided are respectively divided into a plurality of sections on the light incidence surface S1.

The light receiving portion 14 includes a light receiving portion 14a (first light receiving portion) located under the region where the spacer 16 is provided, and a light receiving portion 14b (second light receiving portion) located under the region where the spacer 16 is not provided. The light receiving portions 14a, 14b are provided in a plurality of numbers. To be more detailed, a plurality of light receiving portions 14a are provided in each section where the spacer 16 is provided (white squares in FIG. 3), and a plurality of light receiving portions 14b are provided in each section where the spacer 16 is not provided (shadowed squares in FIG. 3).

On the semiconductor substrate 12, the interconnect layer (an insulating layer including an interconnect) 30 is formed. The interconnect layer 30 includes the interconnect which is not shown.

Figure 4:
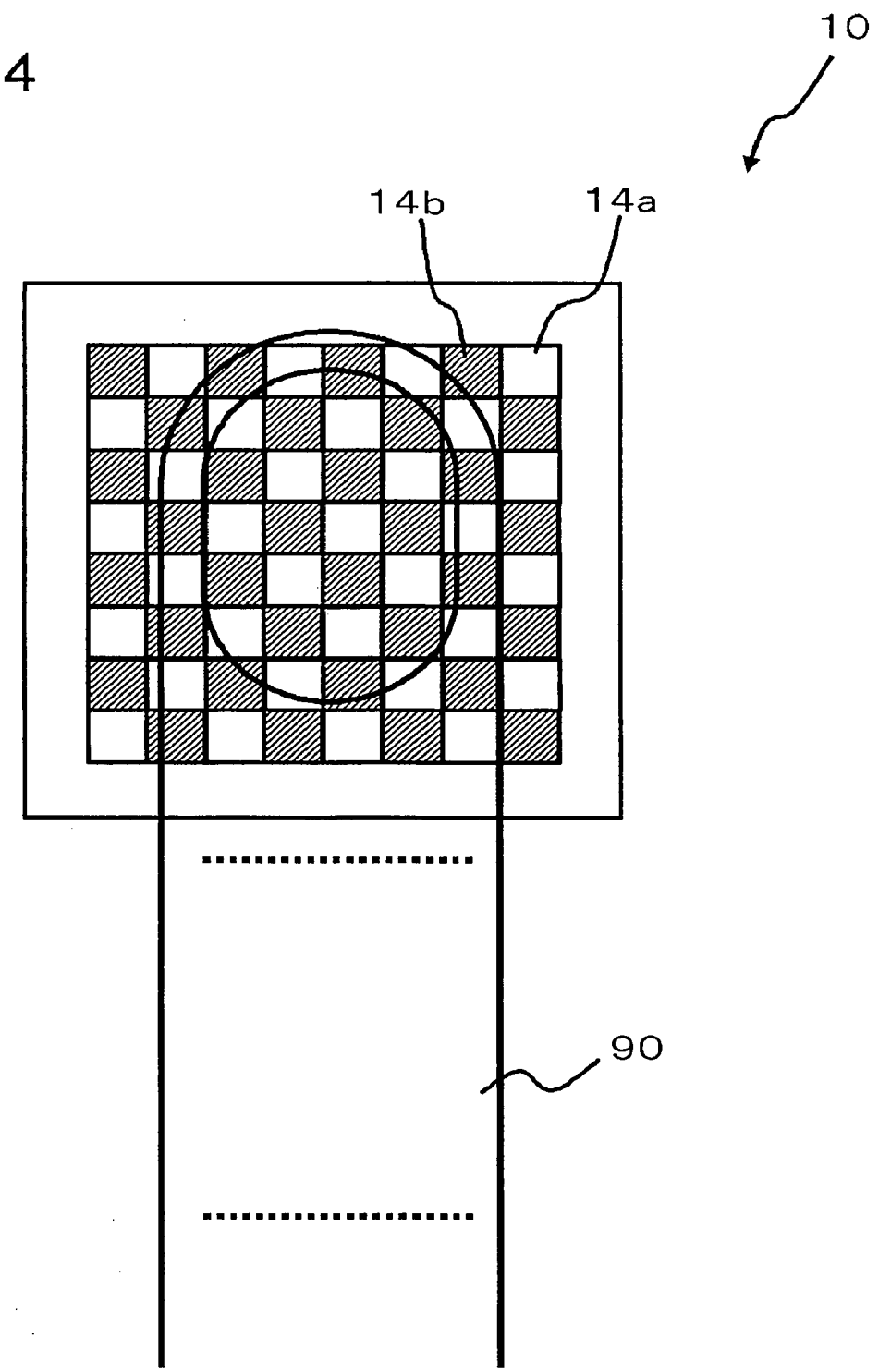
FIG. 4 is a plan view for explaining an imaging method according to an embodiment of the present invention.

Referring now to FIG. 4, an operation of the imaging system 1 will be described hereunder, as an embodiment of the imaging method according to the present invention. In FIG. 4, a finger 90 which is the object to be imaged is brought into contact with the surface of the solid-state imaging device 10, more strictly the surface of the spacers 16. Here, although the finger 90 is in contact with the spacers 16, the finger 90 is kept from contacting the region on the light incidence surface S1 where the spacers 16 are not provided. When light from a light source such as a fluorescent bulb or an LED illuminates the finger 90, the light transmitted through the finger 90 is incident upon the light incidence surface S1. It is preferable that the light is a near-infrared light or an infrared light, though a visible light may also be employed.

Figure 5A:
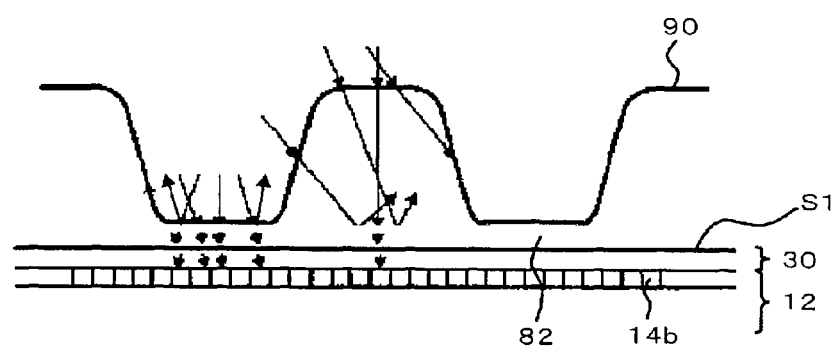
FIGS. 5A and 5B are cross-sectional views showing a status on a light incidence surface during an image pickup.
Figure 5B:
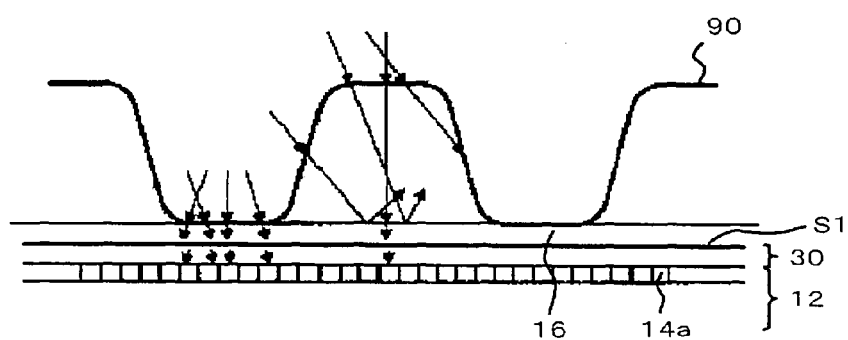
Figure 6:
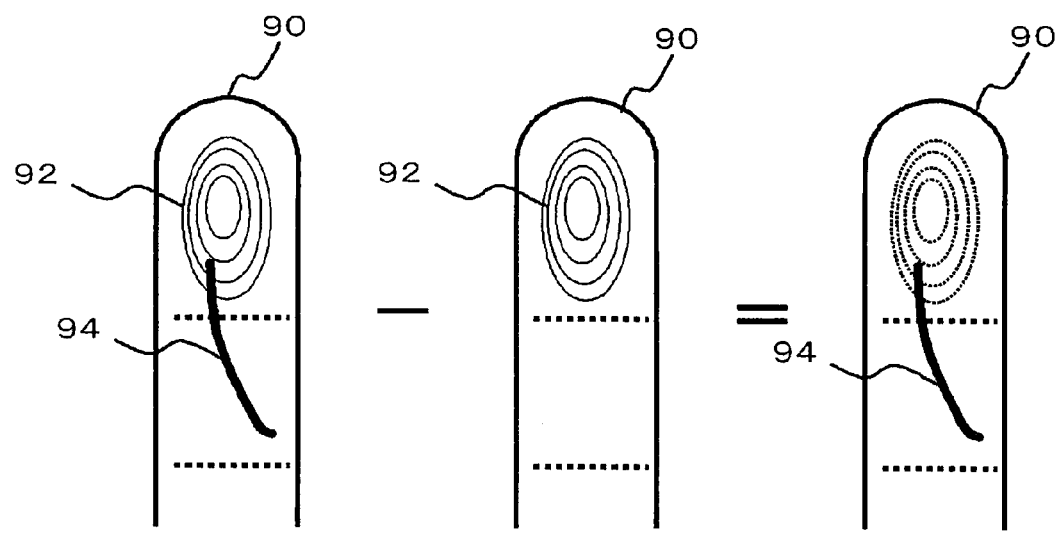
FIG. 6 is an illustration for explaining a first and a second image, and a differential image therebetween.

At this stage, as shown in FIG. 5A, in the region where the spacers 16 are not provided, an air layer 82 is present between the finger 90 and the light incidence surface S1. On the other hand, as shown in FIG. 5B, in the region where the spacers 16 are provided the finger 90 and the spacers 16 are in direct contact. Accordingly, in the former region an image of a fingerprint 92 and a vein 94 (second image) is acquired as the left-side illustration in FIG. 6. That is, in the region where the spacers 16 are not provided, an image including signals not significantly different in intensity between those representing the fingerprint image and those representing the vein image is acquired, because of the presence of the air layer 82 between the finger 90 and the solid-state imaging device 10. In contrast, in the latter region an image of the fingerprint 92 (first image) is acquired, as the central illustration in FIG. 6. That is, the first image is the image of the object to be imaged provided by the light incident upon the light incidence surface S1 through the spacers 16, while the second image is the image of the object to be imaged provided by the light incident upon the light incidence surface S1 without being transmitted through the spacer 16.

The solid-state imaging device 10 thus acquires the first and the second images. Then the difference calculation unit 20 acquires a differential image between those images. In this embodiment, the differential image corresponds to an image of the vein 94 represented by the right-side illustration in FIG. 6.

The foregoing embodiment provides the following advantageous effect. In this embodiment, the solid-state imaging device 10 includes the spacers 16. Accordingly, an image provided by the light from the region where the spacers 16 are provided, namely the light transmitted through the spacers 16 (first image) predominantly includes information of a surface element of the object to be imaged disposed in contact with the spacers 16. On the other hand, an image provided by the light from the region where the spacers 16 are not provided, namely the light not transmitted through the spacers 16 (second image) also includes information of an internal element of the object to be imaged, in addition to the information of the surface element. Picking up the difference between the first image and the second image, therefore, leads to acquisition of a clear image of the internal element of the object to be imaged. In the case where the object to be imaged is a finger as the foregoing embodiment, an image of a vein of the finger can be acquired as an internal element, which enables executing vein identification utilizing the imaging system 1.

The light receiving portion 14 includes the light receiving portion 14a located under the region where the spacer 16 is provided, and the light receiving portion 14b located under the region where the spacer 16 is not provided. Such configuration allows receiving the light from the object to be imaged and transmitted through the spacer 16 with the light receiving portion 14a and the light from the object to be imaged and not transmitted through the spacer 16 with the light receiving portion 14b, thereby acquiring the first and the second images with high sensitivity.

A plurality of light receiving portions 14a are provided in each section where the spacer 16 is provided, and a plurality of light receiving portions 14b are provided in each section where the spacer 16 is not provided. Such arrangement allows acquiring the first and the second images with high resolution.

The spacers 16 are aligned in a checker pattern in a plan view. Such arrangement allows properly acquiring the first and the second images, even when the object to be imaged remains still.

Forming the spacer 16 in a thickness of 10 μm or more further assures that the finger, which is the object to be imaged, is kept from contacting the light incidence surface S1. This is also the case when a ratio of the thickness of the spacer 16 is 0.02 or more with respect to the interval d1. Forming the spacer 16 in a thickness of 250 μm or less facilitates the production of the spacer 16, as well as prevents defocusing. This also applies when a ratio of the thickness of the spacer 16 is 0.5 or less with respect to the interval d1.

Meanwhile, the patent document 2 discloses a solid-state imaging device including a light-shielding layer located on a back surface of the semiconductor substrate, to thereby receive light on the back surface side. This solid-state imaging device detects the light incident through an opening formed on the light-shielding layer. The light-shielding layer serves to block the light from the object to be imaged, and is hence of a different nature from the spacer 16, which transmits the light.

Figure 7:
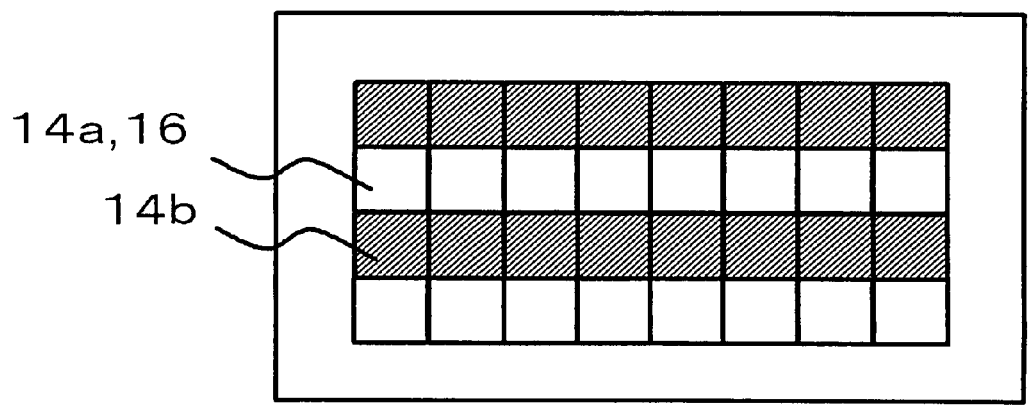
FIG. 7 is a plan view showing a variation of the solid-state imaging device according to the embodiment.
Figure 8:
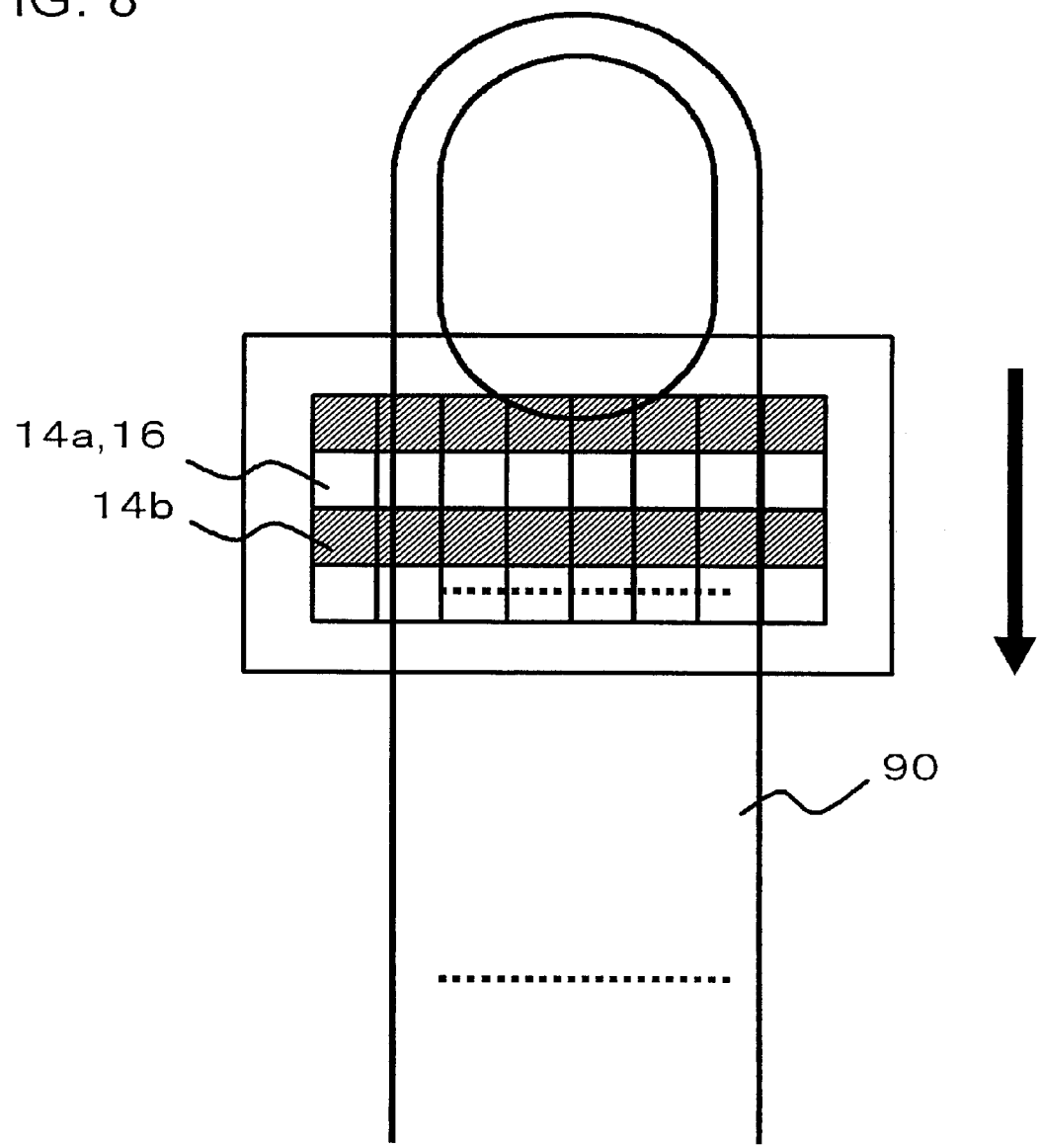
FIG. 8 is a plan view for explaining an imaging method that utilizes the solid-state imaging device of FIG. 7.

The solid-state imaging device, the imaging method and the imaging system according to the present invention are not limited to the foregoing embodiment, but may be modified in various manners. To cite a few examples, while the spacers 16 are aligned in a checker pattern in the embodiment, the spacers 16 may be aligned in a slit pattern as shown in FIG. 7. In this case, it is preferable to pick up the image while moving the object to be imaged in an in-plane direction of the light incidence surface. FIG. 8 depicts an imaging method of moving the finger 90 which is the object to be imaged in a direction perpendicular to a longitudinal direction of the slit (that is, up-and-down direction in FIG. 8) during the image pickup. Moving the object to be imaged during the image pickup allows acquiring an image of a broader area of the object to be imaged, even when the imaging region (region where the light receiving portions 14a, 14b are provided) is small. This is beneficial in reducing the imaging region size, and hence in reducing the overall dimensions of the solid-state imaging device. Here, the object to be imaged may also be moved during the image pickup with the solid-state imaging device 10 shown in FIGS. 2 and 3.

Figure 9:
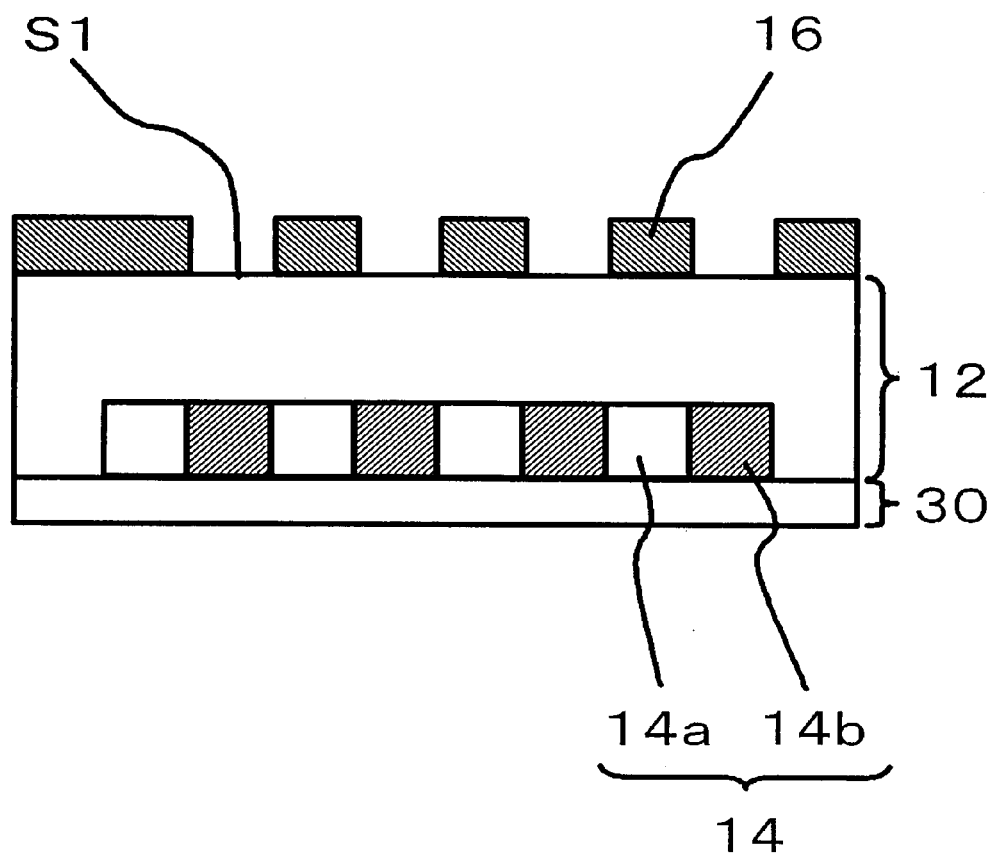
FIG. 9 is a cross-sectional view of another variation of the solid-state imaging device according to the embodiment.

Also, while the solid-state imaging device 10 includes the P-type semiconductor substrate and the N-type light receiving portions, the semiconductor substrate may be of N-type and the light receiving portions may be of P-type. Further, although the solid-state imaging device 10 receives the light on the front surface side, the light may be received on the back surface side as shown in FIG. 9. In FIG. 9, the back surface of the semiconductor substrate 12 is utilized as the light incidence surface S1. Still further, the present invention may also be applied to a solid-state imaging device of a charge-coupled device (CCD) type.

It is apparent that the present invention is not limited to the above embodiment, and may be modified and changed without departing from the scope and spirit of the invention.

What is claimed is:

1. A solid-state imaging device having a light incidence surface for receiving light incident from an object to be imaged, comprising:
   a semiconductor substrate;
   a light receiving portion provided in said semiconductor substrate; and
   a spacer provided on a part of said light incidence surface so as to prevent said object to be imaged from contacting said light incidence surface;
   wherein said spacer transmits said light from said object to be imaged; and
   light from said object to be imaged incident upon said light incidence surface is photoelectrically converted in said semiconductor substrate, so that said light receiving portion receives an electric charge generated by said photoelectric conversion, thereby acquiring an image of said object to be imaged.

2. The solid-state imaging device according to claim 1, wherein said light receiving portion includes a first light receiving portion located under a region where said spacer is provided, and a second light receiving portion located under a region where said spacer is not provided.

3. The solid-state imaging device according to claim 2, wherein a plurality of said first light receiving portions and a plurality of said second light receiving portions are provided.

4. The solid-state imaging device according to claim 2, wherein said region where said spacer is provided and said region where said spacer is not provided are respectively divided into a plurality of sections on said light incidence surface;
   a plurality of said first light receiving portions are provided in each section of said region where said spacer is provided; and
   a plurality of said second light receiving portions are provided in each section of said region where said spacer is not provided.

5. The solid-state imaging device according to claim 1, wherein said spacers are regularly aligned in a plan view.

6. The solid-state imaging device according to claim 5, wherein said spacers are aligned in a checker pattern in a plan view.

7. The solid-state imaging device according to claim 5, wherein said spacers are aligned in a slit pattern in a plan view.

8. The solid-state imaging device according to claim 1, wherein said object to be imaged is a finger; and
   an interval between said spacers is smaller than a width of said finger.

9. The solid-state imaging device according to claim 1, wherein said spacer has a thickness of 0.02 to 0.5, when an interval between said spacers is defined as 1.

10. The solid-state imaging device according to claim 1, wherein said spacer has a thickness of 10 μm to 250 μm.

11. An imaging method, comprising:
    acquiring, with said solid-state imaging device according to claim 1, a first image of said object to be imaged provided by said light transmitted through said spacer thus to be incident upon said light incidence surface.

12. An imaging method, comprising:
    acquiring, with said solid-state imaging device according to claim 1, a second image of said object to be imaged provided by said light not transmitted through said spacer and incident upon said light incidence surface.

13. An imaging method, comprising:

acquiring, with said solid-state imaging device according to claim 1, a first image of said object to be imaged provided by said light transmitted through said spacer thus to be incident upon said light incidence surface, and a second image of said object to be imaged provided by said light not transmitted through said spacer and incident upon said light incidence surface; and acquiring a differential image between said first image and said second image.

14. The imaging method according to claim 13, wherein said acquiring said first and said second images includes shooting said object to be imaged with said object to be imaged disposed in contact with said spacer but not in contact with a region on said light incidence surface where said spacer is not provided.

15. The imaging method according to claim 13, wherein said acquiring said first and said second images includes shooting said object to be imaged with said object to be imaged moved in an in-plane direction of said light incidence surface.

16. The imaging method according to claim 13, wherein said object to be imaged is a finger; and said differential image corresponds to an image of a vein of said finger.

17. An imaging system comprising:

said solid-state imaging device according to claim 1; and a difference calculation unit acquiring a differential image between a first image of said object to be imaged provided by said light transmitted through said spacer thus to be incident upon said light incidence surface, and a second image of said object to be imaged provided by said light not transmitted through said spacer and incident upon said light incidence surface.

\* \* \* \* \*